United States Patent
Teh et al.

(10) Patent No.: US 7,445,978 B2
(45) Date of Patent: Nov. 4, 2008

(54) METHOD TO REMOVE SPACER AFTER SALICIDATION TO ENHANCE CONTACT ETCH STOP LINER STRESS ON MOS

(75) Inventors: Young Way Teh, Singapore (SG); Yong Meng Lee, Singapore (SG); Chung Woh Lai, Singapore (SG); Wenhe Lin, Singapore (SG); Khee Yong Lim, Singapore (SG); Wee Leng Tan, Singapore (SG); John Sudijono, Singapore (SG); Hui Peng Koh, Singapore (SG); Liang Choo Hsia, Singapore (SG)

(73) Assignee: Chartered Semiconductor Manufacturing, Ltd, Singapore (SG)

( * ) Notice: Subject to any disclaimer, the term of this patent is extended or adjusted under 35 U.S.C. 154(b) by 248 days.

(21) Appl. No.: 11/122,666

(22) Filed: May 4, 2005

(65) Prior Publication Data

US 2006/0249794 A1 Nov. 9, 2006

(51) Int. Cl.
*H01L 21/8238* (2006.01)
(52) U.S. Cl. ............... 438/199; 438/201; 257/E27.046
(58) Field of Classification Search ................. 438/199, 438/201
See application file for complete search history.

(56) References Cited

U.S. PATENT DOCUMENTS

| 6,573,172 | B1 | 6/2003 | En |
| 6,825,529 | B2 | 11/2004 | Chidambarrao |
| 2003/0040158 | A1 | 2/2003 | Saitoh |
| 2004/0029323 | A1* | 2/2004 | Shimizu et al. ............. 438/142 |
| 2004/0104405 | A1 | 6/2004 | Huang |
| 2004/0113217 | A1 | 6/2004 | Chidambarrao |
| 2004/0262784 | A1 | 12/2004 | Doris |
| 2005/0112817 | A1* | 5/2005 | Cheng et al. ................. 438/219 |
| 2006/0199326 | A1* | 9/2006 | Zhu et al. .................... 438/201 |
| 2006/0234455 | A1* | 10/2006 | Chen et al. .................. 438/276 |

* cited by examiner

*Primary Examiner*—Thanh Nguyen
(74) *Attorney, Agent, or Firm*—Horizon IP Pte Ltd

(57) ABSTRACT

An example process to remove spacers from the gate of a NMOS transistor. A stress creating layer is formed over the NMOS and PMOS transistors and the substrate. In an embodiment, the spacers on gate are removed so that stress layer is closer to the channel of the device. The stress creating layer is preferably a tensile nitride layer. The stress creating layer is preferably a contact etch stop liner layer. In an embodiment, the gates, source and drain region have an silicide layer thereover before the stress creating layer is formed. The embodiment improves the performance of the NMOS transistors.

31 Claims, 4 Drawing Sheets

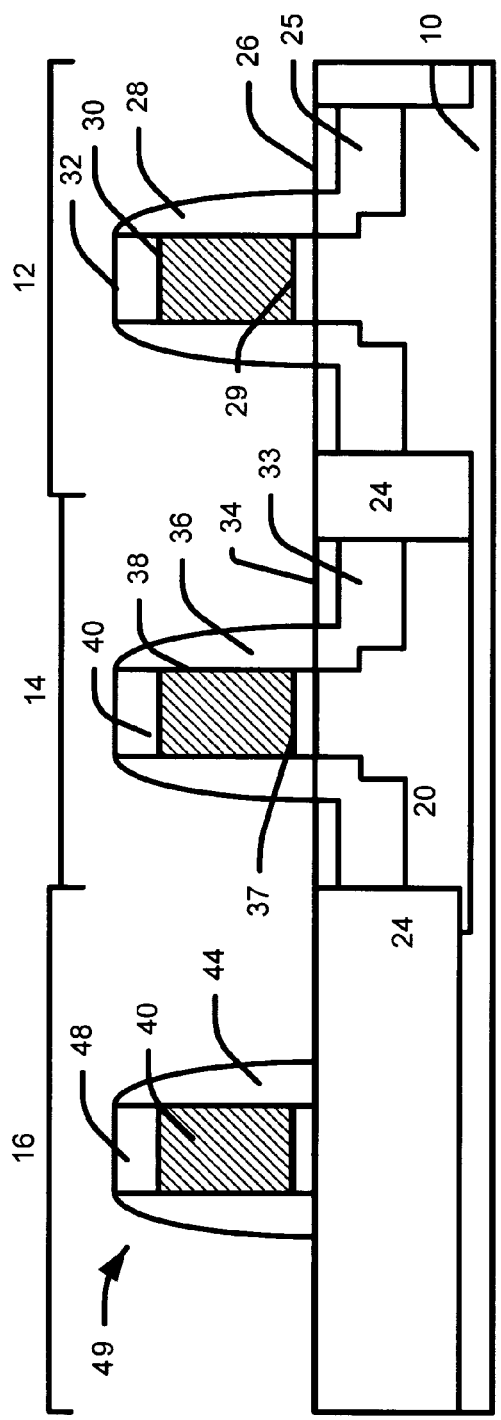
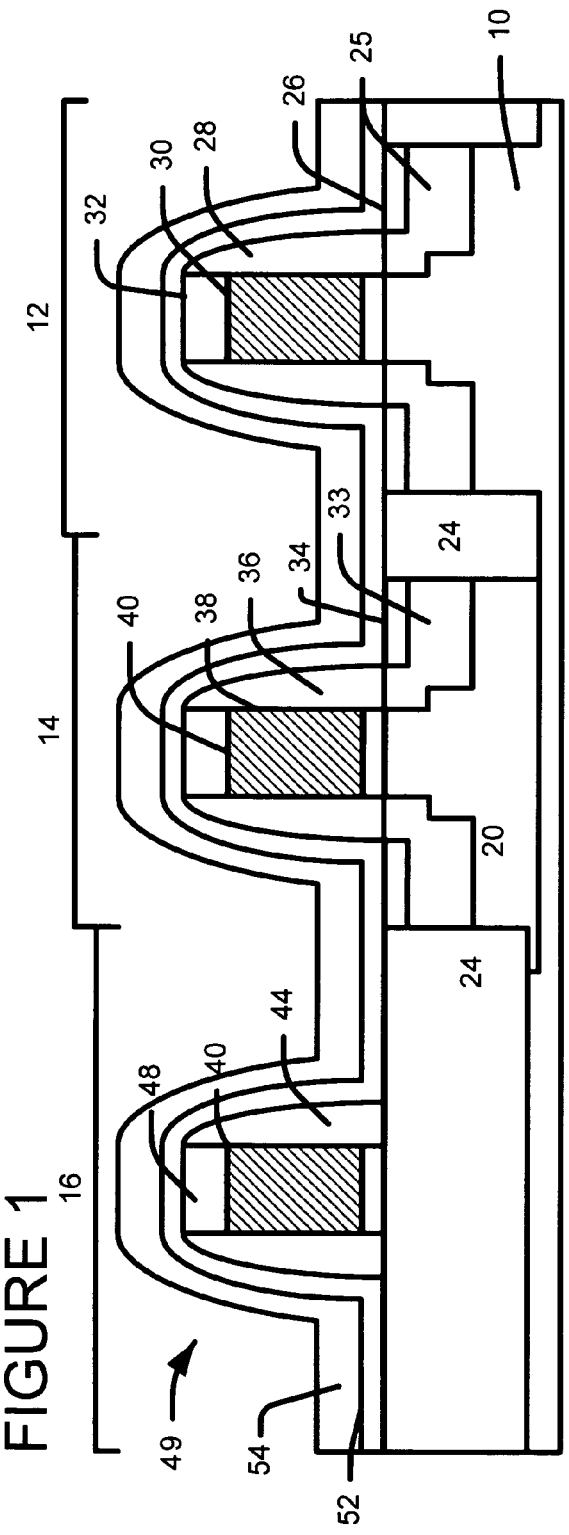

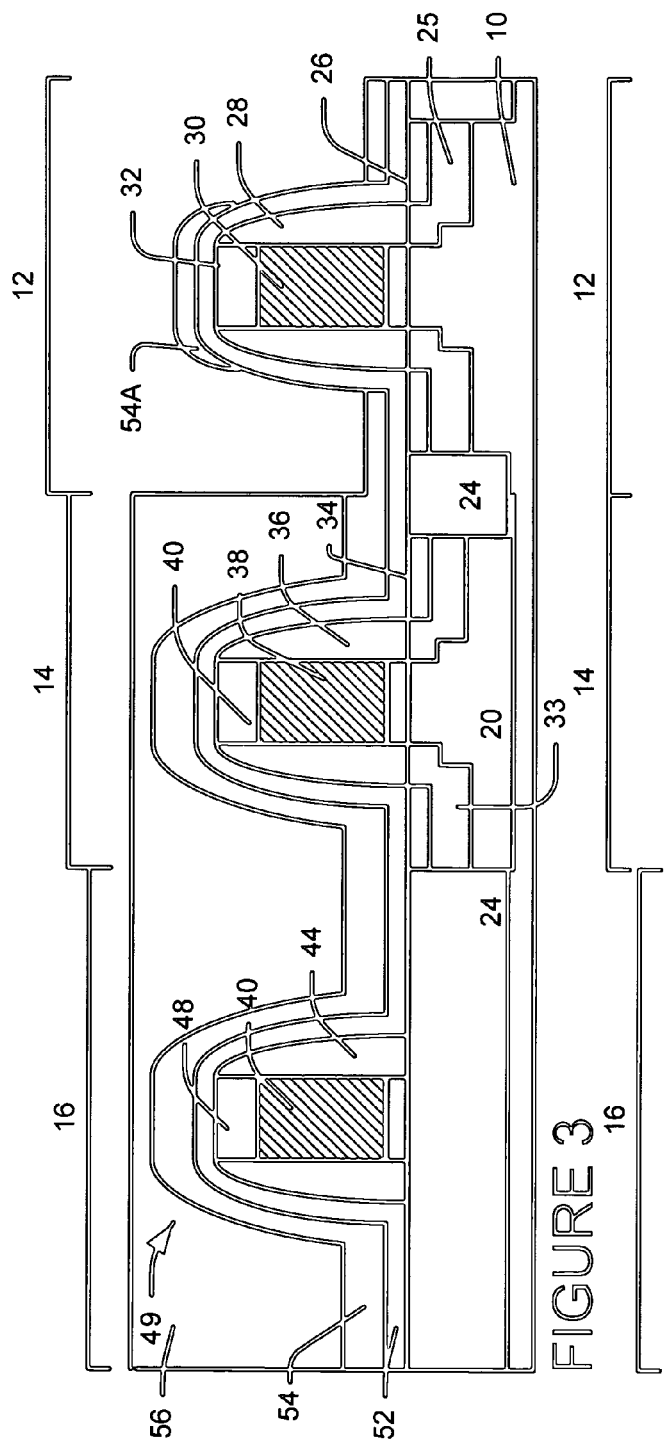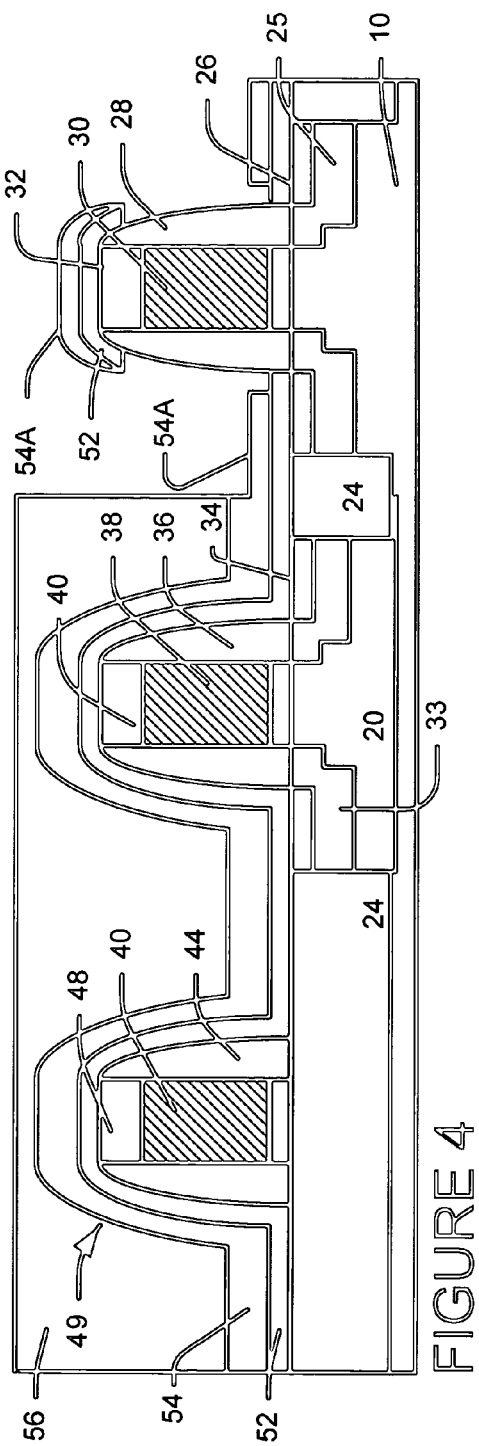

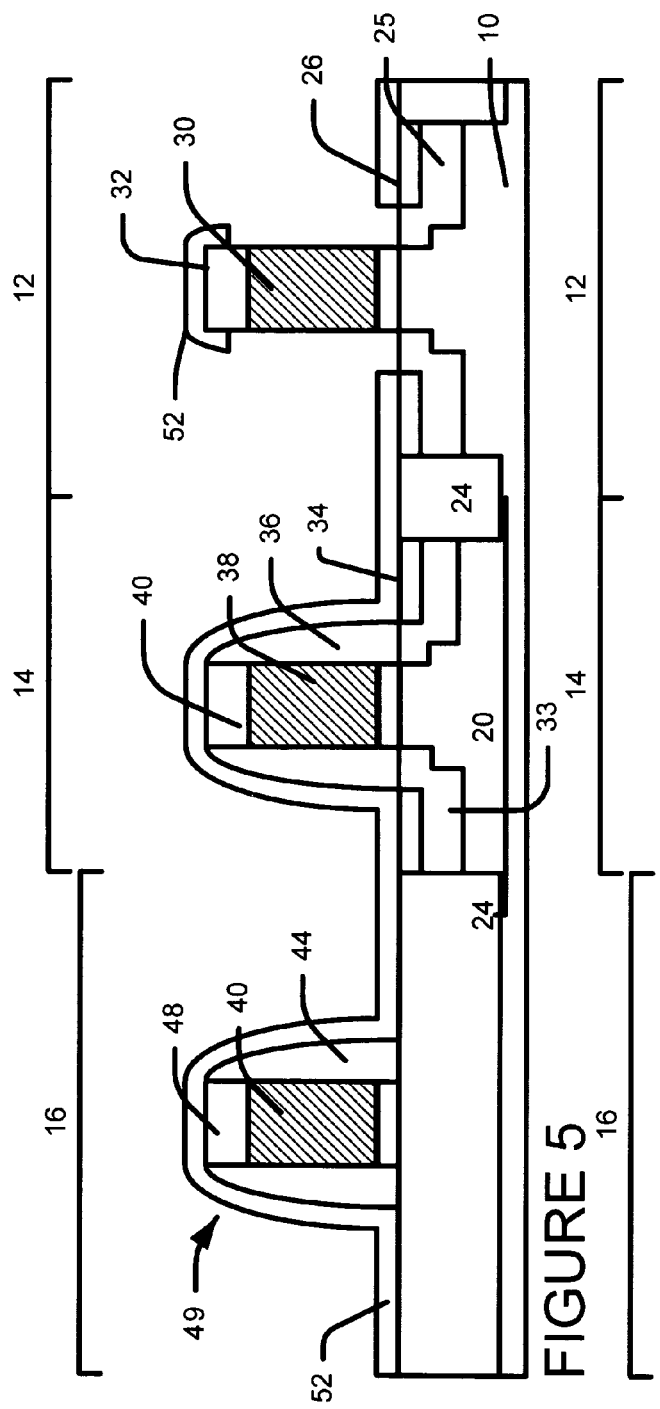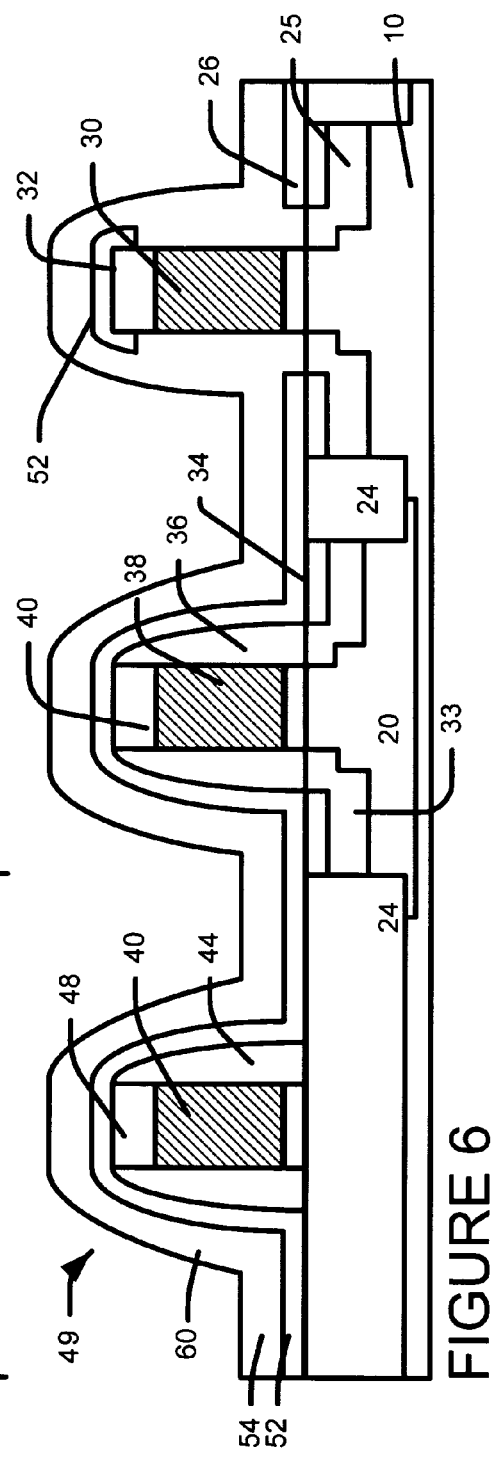

METHOD TO REMOVE SPACER AFTER SALICIDATION TO ENHANCE CONTACT ETCH STOP LINER STRESS ON MOS

BACKGROUND OF INVENTION

1) Field of the Invention

This invention relates generally to structures and method for fabricating semiconductor devices and more particularly structures and method for inducing stresses of different areas of a substrate.

2) Description of the Prior Art

As semiconductor device switching speeds continue to increase and operating voltage levels continue to decrease, the performance of MOS and other types of transistors needs to be correspondingly improved. The carrier mobility in a MOS transistor has a significant impact on power consumption and switching performance, where improvement in carrier mobility allows faster switching speeds. The carrier mobility is a measure of the average speed of a carrier (e.g., holes or electrons) in a given semiconductor, given by the average drift velocity of the carrier per unit electric field. Improving carrier mobility can improve the switching speed of a MOS transistor, as well as allow operation at lower voltages.

One way of improving carrier mobility involves reducing the channel length and gate dielectric thickness in order to improve current drive and switching performance. However, this approach may increase gate tunneling current, which in turn degrades the performance of the device by increasing off state leakage. In addition, decreasing gate length generally calls for more complicated and costly lithography processing methods and systems.

The importance of overcoming the various deficiencies is evidenced by the extensive technological development directed to the subject, as documented by the relevant patent and technical literature. The closest and apparently more relevant technical developments in the patent literature can be gleaned by considering the following.

US 20040262784 High performance cmos device structures and method of manufacture—A semiconductor device structure includes at least two field effect transistors formed on same substrate, the first field effect transistor includes a spacer having a first width, the second field effect transistor includes a compressive spacer having a second width, the first width being different than said second width. Preferably, the first width is narrower than the second width. A tensile stress dielectric film forms a barrier etch stop layer over the transistors. Inventors: Bruce B. Doris, et al.

U.S. Pat. No. 6,825,529: and US 20040113217A1: Stress inducing spacers—Spacer structure for semiconductor devices formed in substrate, has two spacer structures, each comprising stress inducing material adjacent to both sidewall of one of device's gate terminal and its channel which applies mechanical stress—Inventor: Chidambarrao US20040104405A1: Novel CMOS device—Improving mobility of holes and electrons within semiconductor device structure, involves forming first and second stress layers over p- and n-type metal oxide semiconductor device respectively—Inventor: Huang U.S. Pat. No. 6,573,172: Methods for improving carrier mobility of PMOS and NMOS devices—Fabrication of semiconductor device by forming P-channel and N-channel metal oxide semiconductor transistors in wafer, forming tensile film on P-channel transistor and forming compressive film on N-channel transistor—Inventor: En, et al.

US20030040158A1: Semiconductor device and method of fabricating the same—Semiconductor device includes first nitride layer containing tensile stress and second nitride layer containing compressive stress—Inventor: Saitoh, Takehiro Thus, there remains a need for methods by which the carrier mobility of both NMOS and PMOS transistors may be improved so as to facilitate improved switching speed and low-power, low-voltage operation of CMOS devices, without significantly adding to the cost or complexity of the manufacturing process.

SUMMARY OF THE INVENTION

The embodiments of the present invention provides a structure and a method of manufacturing a FET device without spacer and with an overlying stress layer improves device performance which is characterized as follows.

An example embodiment of the invention is a method of fabrication semiconductor device; comprising the steps of:
providing a substrate having a first region and a second region;
providing a first gate, first source/drain regions in said first region; a first channel region in said first region under said first gate; providing a second gate, second spacers on the second gate sidewalls; second source/drain regions in said second region adjacent to said second spacers;
forming a stress dielectric layer over: the first gate, the first source/drain regions, the second gate, the second spacers and the second source/drain regions; whereby said stress dielectric layer serves to puts stress on the first channel region on the substrate close to the first gate.

Another example embodiment of the invention is a method of fabrication semiconductor device; comprising the steps of:
providing a substrate having a first region and a second region;
providing a first gate, first spacers on the first gate sidewalls; first source/drain regions in the first region adjacent to the first spacers; providing first S/D silicide regions over the first source/drain regions;
providing a second gate, second spacers on the second gate sidewalls; second source/drain regions in the second region adjacent to the second spacers; providing second S/D silicide regions over the second source/drain regions;
forming a conformal dielectric layer over the substrate at least the first region and the second region;
forming a non-conformal dielectric layer over the conformal dielectric layer; the non-conformal dielectric layer is thicker over the second cap and first cap and the substrate than over the second and first spacer sidewalls;
removing a first thickness of the non-conformal dielectric layer in the first region; using an etch, to expose the conformal dielectric layer over the first spacers;
removing the first spacers using an etch;
removing the non-conformal dielectric layer;
forming a stress dielectric layer which serves to puts stress on the stress on the substrate close to the first gate where the first spacers were removed in the first region thereby enhance the first device performance.

An aspect of this embodiment is wherein the first region is a NFET region and the second region is a PFET region; and the stress dielectric layer produces a compressive stress on the NFET channel in a uni-axial direction; and the channel has a 110 crystal orientation.

An example embodiment of the invention is a semiconductor device comprises:

a substrate having a first region and a second region;

a first gate, first source/drain regions in the first region adjacent to the first spacers; providing first S/D silicide regions over the first source/drain regions;

a second gate over the second region, second spacers on the second gate sidewalls; second source/drain regions in the second region adjacent to the second spacers; second S/D suicide regions over the second source/drain regions;

a conformal dielectric layer over the second gate and the second spacers, the second S/D silicide regions, and the first S/D silicide regions;

a stress dielectric layer over the sidewalls of the first gate and over the substrate adjacent to the first gate; the stress dielectric layer which serves to puts stress on the stress on the substrate close to the first gate which does not have first spacers thereby enhance the first device performance;

the stress dielectric layer over the sidewalls of the second spacers and the second gate.

An aspect of this embodiment is wherein the first region is a NFET region and the second region is a PFET region; the stress dielectric layer is a tensile stress layer; and the stress dielectric layer produces a compressive stress on the NFET channel in a uni-axial direction; and the NFET channel has a 110 crystal orientation.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 6 are cross sectional views for illustrating a method for manufacturing a transistor according to a first example embodiment of the present invention.

DETAILED DESCRIPTION OF THE EXAMPLE EMBODIMENTS

First Example Embodiment

Figure 7:
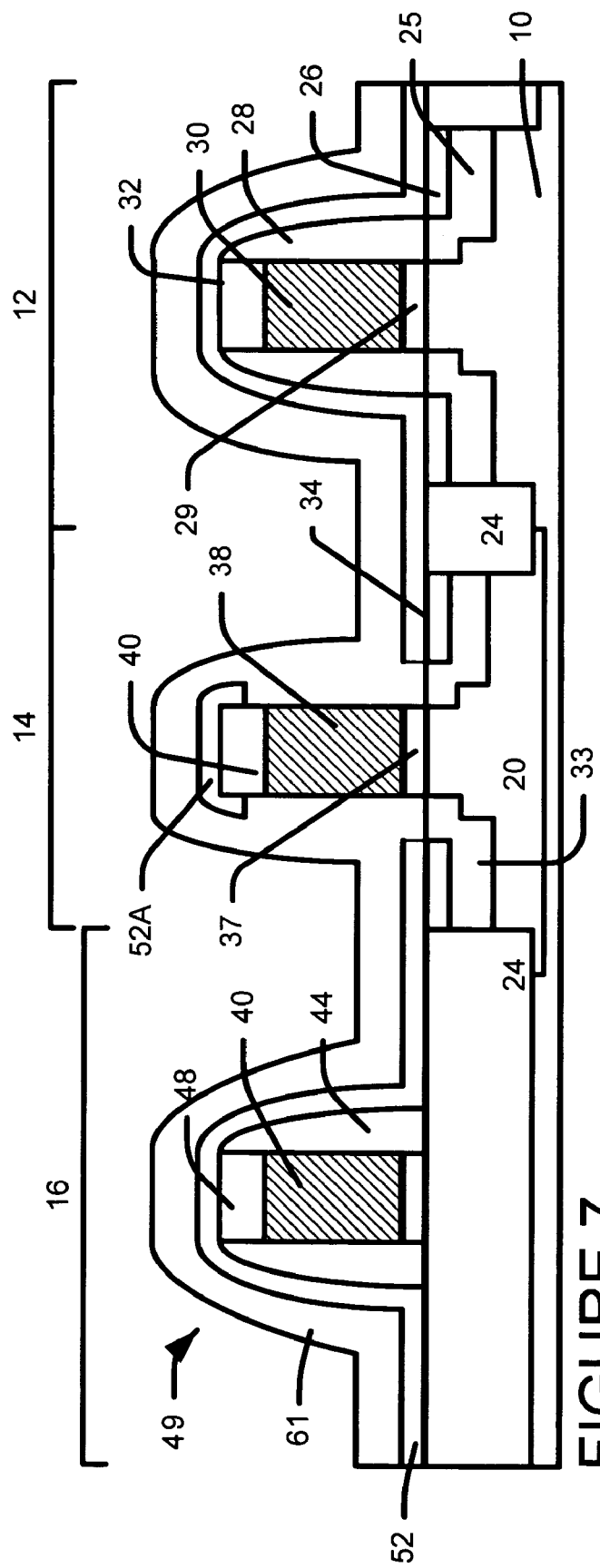
FIG. 7 is cross sectional view for illustrating a method for manufacturing a transistor according to a second example embodiment of the present invention.

The example embodiments of the present invention will be described in detail with reference to the accompanying drawings. The example embodiments provide methods of applying a stress on a channel of an MOS transistor using a stress layer in silicide process. Preferably, the source drain regions have a suicide contact layer thereover. An embodiment removes spaces from a gate and forms a stress layer on or adjacent to the gate. The spacers can be removed from either the PMOS or the NMOS transistor.

A. Substrate has a NFET Region and a PFET Region

As shown in FIG. 1, we provide a substrate having a NFET region 12, a PFET region 14 and an optional peripheral region 16. The substrate can have isolation region(s) 24 at least between the NFET region 12, the PFET region 14 and the peripheral region 16.

In the NFET region, we provide a NFET transistor that can be comprised of NFET gate dielectric 29, a NFET gate 30, NFET cap 32, a NFET spacers on the NFET gate 30 sidewalls; NFET source/drain regions 25 in the NFET region adjacent to the NFET spacers 26. We provide NFET S/D silicide regions 26 over the NFET source/drain regions 25 and the NFET cap 32 preferably comprised of silicide. The NFET transistor has a NFET channel under the NFET gate. A NFET channel is in the NFET region under the NFET gate.

In the PFET region 14, we provide a PFET transistor that can be comprised of a PFET gate dielectric layer 27, a PFET gate 38, PFET cap 40, PFET spacers 36 on the PFET gate 38 sidewalls. We provide PFET source/drain regions 33 in the PFET region 14 adjacent to the PFET spacers 36. PFET S/D silicide regions 34 are formed over the PFET source/drain regions 33. The PFET cap 40 is preferably comprised of a silicide. A PFET channel is in the PFET region under the PFET gate.

In the peripheral region, we provide peripheral gate structure 49 over the peripheral region 16. The peripheral gate structures are comprised of a peripheral gate 40, peripheral spacer 44 and peripheral cap 48.

The substrate has an (peripheral) isolation region 24 over at least a portion of the peripheral region 16; and the peripheral gate structure 49 can be over the isolation region.

The structures can be made using a salicide process.

B. Conformal Dielectric Layer

Referring to FIG. 2, we form a conformal dielectric layer 52 (about or substantially uniform thickness) over the substrate at least the NFET region 12, the PFET region 14 and the peripheral region 16. The conformal dielectric layer preferably has about uniform thickness.

The conformal dielectric layer 52 can be comprised of oxide or silicon oxynitride (SiON) and can have a thickness between 50 and 100 angstroms.

C. Non-Conformal Dielectric Layer

We then form a non-conformal dielectric layer 54 over the conformal dielectric layer 52. The non-conformal dielectric layer can be comprised of nitride or SiC. A nitride non-conformal dielectric layer can be formed using a PECVD process.

The non-conformal dielectric layer 54 is thicker over about horizontal surfaces than over sloped or vertical surfaces. The non-conformal dielectric layer 54 can be between 150% and 400% thicker over about horizontal surfaces than over sloped or vertical surfaces. The tops of the gates and the substrate are about horizontal. The spacer sidewalls are sloped.

The non-conformal layer 54 is thicker over the PFET cap 40 and NFET cap 32 and the substrate than over the PFET and NFET spacer 36 28 sidewalls.

For example, the non-conformal layer 54 can have a thickness between 300 and 400 angstroms over the PFET cap 40 and NFET cap 32 and the substrate; and a thickness between 100 and 200 angstroms over the PFET and NFET spacer 36 28 sidewalls.

D. Remove a First Thickness of the Non-Conformal Nitride Layer in the NFET Region As shown in FIG. 3, we remove a first thickness (portion) of the non-conformal nitride layer 54 in the NFET region 12 to expose at least a portion of the conformal dielectric layer 52 over the NMOS spacers 28.

A photoresist layer 56 can be formed over the non-NMOS regions (e.g. PMOS region 14 and peripheral region 16).

The etch can be an isotropic etch can be a such as a wet etch or Chemical Down Stream Etch (CDE).

The first thickness is between about 33 and 66% of the maximum thickness of the non-conformal nitride layer 54.

Due to the poor step coverage of the non-conformal layer over the spacers, the non-conformal layer is etched away before the non-conformal layer over the horizontal surfaces (e.g., cap, silicide regions 26, isolation regions 24, etc.).

Next, we remove the NMOS spacers 28.

An example option is shown in FIGS. 4 and 5.

E. Remove the Conformal Dielectric Layer Over the NMOS Spacers

FIG. 4 shows the PFET mask 56 over the NFET region 14 and the peripheral region 16, We remove the exposed conformal dielectric layer 52 over the NMOS spacers 28 to expose the NMOS spacers 28. The conformal dielectric layer 52 can be removed using an isotopic etch.

F. Remove the NMOS Spacers

As shown in FIG. 5, we etch the NMOS spacers 28. The etch can be an isotropic etch that is selective to the spacer material. The etch preferably exposed the substrate surface immediately adjacent to the gate 30.

Then we remove the mask 56.

G. Remove the Non-Conformal Nitride Layer

As shown in FIG. 5, we remove the non-conformal layer 54. The non-conformal nitride layer 54 can be removed using a etch selective to oxide.

The silicide regions 26 34 are protected by the conformal dielectric layer 52 during this nitride etch.

H. Form a Tensile Dielectric Layer

As shown in FIG. 6, we form a tensile dielectric layer 60 (e.g., tensile stress nitride) which serves to put a compressive stress on the substrate close to the gate (where the spacers 28 used to be) in the NMOS region 12, which in turn cause a tensile strain in the NMOS channel region (Si below Poly 30), thereby enhance the NMOS transistor performance. The tensile dielectric layer can serve as a contact etch stop liner (ESL).

The PMOS transistor device is affected less than the NMOS device because the PMOS spacers 36 separate and space the tensile nitride layer 60 from the substrate under the PMOS spacers 36 and the PMOS channel region.

The tensile dielectric (e.g., nitride) layer causes a tensile stress in a channel region of the NMOS transistor.

The stress is preferably in an Uni-axial direction only. A preferred channel has a 110 crystal orientation. Uni-axial strain means the strain is in X and Y directions, not in the Z direction.

A feature of the embodiment is that because the spacers are removed, the stressor is nearer to the channel thus enhancing the strain effect.

The device can be finished using conventional process such as forming a ILD layer, contacts, and subsequent levels of IMD and interconnects.

Alternate Embodiment

FIG. 7 shows an alternate embodiment where the spacers on the PMOS gate device 38 40 are removed. The process for this embodiment can be similar to the first embodiment by masking the non-PMOS regions and removing the PMOS spacers 36. Stress layer 61 is formed over the substrate surface. For this PMOS embodiment, the stress layer 61 is a compressive film.

The stress layer 61 preferably puts a tensile stress on the substrate near the PMOS gate, which in turn causes a compressive strain on the PMOS channel (Si below Poly 38). This enhances the PMOS transistor.

A. Non-Limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a semiconductor device comprising:
providing a substrate having a first region and a second region;
providing a first transistor in said first region having a first gate with exposed first gate sidewalls, first source/drain regions adjacent to said first gate, and a first channel region under said first gate;
providing a second transistor in said second region having a second gate, second spacers over second gate sidewalls of said second gate, second source/drain regions adjacent to said second spacers, and a second channel region under said second gate; and forming a stress dielectric layer having a first stress over the first and second transistors, the stress dielectric layer contacting the exposed first gate sidewalls, the stress dielectric layer remains over the first and second transistors, wherein the second transistor is less affected by the stress dielectric layer than the first transistor.

2. The method of claim 1 wherein:

the first transistor comprises a N-type transistor, the second transistor comprises a P-type transistor, and the first stress comprises a tensile stress; or the first transistor comprises a P-type transistor, the second transistor comprises a N-type transistor, and the first stress comprises a compressive stress.

3. The method of claim 2 wherein the first stress is in a uni-axial direction, and the first channel has a 110 crystal orientation.

4. The method of claim 1 comprises:

forming a dielectric layer over the first and second transistors prior to forming the stress dielectric layer; and removing the dielectric layer over the first transistor to expose the first gate sidewalls.

5. The method of claim 1 wherein the first transistor comprises first spacers on the first gate sidewalls, wherein the first spacers are removed to expose the first gate sidewalls.

6. The method of claim 5 wherein:

the first transistor comprises a N-type transistor, the second transistor comprises a P-type transistor, and the first stress comprises a tensile stress; or the first transistor comprises a P-type transistor, the second transistor comprises a N-type transistor, and the first stress comprises a compressive stress.

7. The method of claim 6 wherein the first stress is in a uni-axial direction, and the first channel has a 110 crystal orientation.

8. The method of claim 5 comprises:

forming a dielectric layer over the first and second transistors prior to forming the stress dielectric layer; and removing portions of the dielectric layer covering the first spacers on the first gate sidewalls to expose the first spacers.

9. The method of claim 8 wherein:

the first transistor comprises a N-type transistor, the second transistor comprises a P-type transistor, and the first stress comprises a tensile stress; or the first transistor comprises a P-type transistor, the second transistor comprises a N-type transistor, and the first stress comprises a compressive stress.

10. The method of claim 9 wherein the first stress is in a uni-axial direction, and the first channel has a 110 crystal orientation.

11. The method of claim 5 comprises:

forming a dielectric layer over the first and second transistors prior to forming the stress dielectric layer;

forming a non-conformal layer over the dielectric layer; and removing portions of the dielectric and non-conformal layer covering the first spacers on the first gate sidewalls to expose the first spacers.

12. The method of claim 11 wherein:

the first transistor comprises a N-type transistor, the second transistor comprises a P-type transistor, and the first stress comprises a tensile stress; or the first transistor comprises a P-type transistor, the second transistor comprises a N-type transistor, and the first stress comprises a compressive stress.

13. The method of claim 12 wherein the first stress is in a uni-axial direction, and the first channel has a 110 crystal orientation.

14. A method of fabrication of a semiconductor device comprising the steps of:

a) providing a substrate having a first region and a second region;

b) providing a first gate dielectric layer, a first gate, first spacers on first gate sidewalls, and first source/drain regions in said first region adjacent to said first spacers; said first spacers having first spacer sidewalls;

c) providing a second gate dielectric layer, a second gate, second spacers on second gate sidewalls; and second source/drain regions in said second region adjacent to said second spacers; said second spacers having second spacer sidewalls;

d) forming a dielectric layer over the substrate over at least the first region and the second region;

e) forming a non-conformal dielectric layer over said substrate;

(1) the non-conformal dielectric layer is thicker over a top of the first gate, the second gate and the substrate, than over the first spacer sidewalls and the second spacer sidewalls;

f) removing a first thickness of the non-conformal dielectric layer over the first region, using a first etch, to expose at least a portion of the dielectric layer over the first spacers;

g) removing the exposed portion of the dielectric layer and said first spacers using an etch process;

h) removing the non-conformal dielectric layer; and i) forming a stress dielectric layer over said substrate.

15. The method of claim 14 wherein said first region is a NFET region and said second region is a PFET region; and said stress dielectric layer produces a tensile stress on a NFET channel in a uni-axial direction; and the NFET channel has a 110 crystal orientation.

16. The method of claim 14 wherein said first region is a PFET region and said second region is a NFET region; and said stress dielectric layer produces a compressive stress on a PFET channel in a uni-axial direction; and the PFET channel has a 110 crystal orientation.

17. The method of claim 14 wherein forming the stress dielectric layer causes a tensile stress in a channel region of a NMOS transistor.

18. The method of claim 14 wherein said dielectric layer is comprised of oxide or silicon oxynitride; and said dielectric layer is a conformal dielectric layer.

19. The method of claim 14 wherein said non-conformal dielectric layer is thicker over about horizontal surfaces than over sloped or vertical surfaces; said non-conformal dielectric layer is thicker over the first spacer sidewalls than over a top of said first gate and over said first source/drain regions.

20. The method of claim 14 wherein said the non-conformal dielectric layer is between about 150% and 400% thicker over about horizontal surfaces than over sloped or vertical surfaces.

21. The method of claim 14 wherein the first thickness is between about 33 and 66% of a maximum thickness of said non-conformal dielectric layer.

22. The method of claim 14 which further comprises:

providing silicide regions over said first source/drain regions and said second source/drain regions.

23. A method of fabrication semiconductor device comprising the steps of:
   a) providing a substrate having a NFET region and a PFET region;
   b) providing a NFET gate dielectric, a NFET gate, NFET spacers on NFET gate sidewalls, NFET source/drain regions in said NFET region adjacent to said NFET spacers; and providing NFET S/D suicide regions over said NFET source/drain regions;
   c) providing a PFET gate dielectric, a PFET gate, PFET spacers on PFET gate sidewalls; PFET source/drain regions in said PFET region adjacent to said PFET spacers; and providing PFET S/D suicide regions over said PFET source/drain regions;
   d) forming a conformal dielectric layer over the substrate over at least the NFET region and the PFET region;
   e) forming a non-conformal dielectric layer over said conformal dielectric layer;
   f) removing a first thickness of the non-conformal dielectric layer over the NFET region, using a first etch, to expose the conformal dielectric layer over the NFET spacers;
      (1) the first thickness is between about 33 and 66% of a maximum thickness of said non-conformal dielectric layer;
   g) removing the exposed conformal dielectric layer over the NFET spacers and the NFET spacers using an etch process;
   h) removing the non-conformal dielectric layer; and
   i) forming a tensile stress dielectric layer over said substrate.

24. The method of claim 23 wherein forming the tensile stress dielectric layer causes a tensile stress in a channel region of the NMOS transistor.

25. The method of claim 23 wherein the tensile stress dielectric layer produces a tensile stress on a NFET channel in a uni-axial direction; and the NFET channel has a 110 crystal orientation.

26. The method of claim 23 wherein the non-conformal dielectric layer is thicker over the PFET gate and NFET gate and the substrate than over PFET and NFET spacer sidewalls.

27. The method of claim 23 wherein the non-conformal dielectric layer is thicker over about horizontal surfaces than over sloped or vertical surfaces.

28. The method of claim 23 wherein the non-conformal dielectric layer is between about 150% and 400% thicker over about horizontal surfaces than over sloped or vertical surfaces.

29. The method of claim 23 wherein said conformal dielectric layer is comprised of oxide or silicon oxynitride; and said conformal dielectric layer has a thickness between 50 and 100 angstroms.

30. A method of fabrication of a semiconductor device comprising:
   providing a substrate having a first region and a second region;
   providing a first transistor in the first region having a first gate, exposed first spacers over first gate sidewalls of the first gate, first source/drain regions adjacent to the first gate, and a first channel region under the first gate;
   providing a second transistor in the second region having a second gate, second spacers over second gate sidewalls of the second gate, second source/drain regions adjacent to the second spacers, and a second channel region under the second gate;
   forming a dielectric layer in the first and second regions;
   forming a non-conformal dielectric layer over the dielectric layer;
   removing portions of the dielectric and non-conformal dielectric layers over the first transistor to expose the first spacers;
   removing the first spacers to expose the first gate sidewalls; and
   forming a stress dielectric layer having a first stress over the first and second transistors, the stress dielectric layer remains over the first and second transistors and contacts the exposed first gate sidewalls, wherein the second transistor is less affected by the stress dielectric layer than the first transistor.

31. The method of claim 30 wherein:
   the first transistor comprises a N-type transistor, the second transistor comprises a P-type transistor and the first stress comprises a tensile stress; or
   the first transistor comprises a P-type transistor, the second transistor comprises a N-type transistor and the first stress comprises a compressive stress.

* * * * *